United States Patent [19]

Throngnumchai

[11] Patent Number: 5,317,175
[45] Date of Patent: May 31, 1994

[54] CMOS DEVICE WITH PERPENDICULAR CHANNEL CURRENT DIRECTIONS

[75] Inventor: Kraisorn Throngnumchai, Kanagawa, Japan

[73] Assignee: Nissan Motor Co., Ltd., Yokohama, Japan

[21] Appl. No.: 827,319

[22] Filed: Jan. 29, 1992

[30] Foreign Application Priority Data

Feb. 8, 1991 [JP] Japan .................. 3-017916

[51] Int. Cl.$^5$ .................. H01L 27/02; H01L 27/10
[52] U.S. Cl. .................. 257/255; 257/206; 257/287; 257/369; 257/401
[58] Field of Search ........... 257/206, 255, 274, 287, 257/369, 401, 208, 266, 341, 365, 909

[56] References Cited

U.S. PATENT DOCUMENTS

| | | | |
|---|---|---|---|
| 3,476,991 | 11/1969 | Mize et al. | 257/255 |
| 3,603,848 | 9/1971 | Sato et al. | 257/255 |
| 4,668,972 | 5/1987 | Sato et al. | 257/369 |
| 4,816,887 | 3/1989 | Sato | 257/206 |
| 4,857,986 | 8/1989 | Kinugawa | 257/255 |

OTHER PUBLICATIONS

"Fully Symmetric Cooled CMOS on (110) Plane", by M. Aoki et al, IEEE Transactions on Electron Devices, vol. IE-ED, No. 8, Aug. 1989, pp. 1429–1433.

Primary Examiner—Rolf Hille
Assistant Examiner—Mahshid Saadat
Attorney, Agent, or Firm—Lowe, Price, LeBlanc & Becker

[57] ABSTRACT

P channel MOSFET and N channel MOSFET are formed in a (011) orientated semiconductor surface in such a manner that the channel of the P channel MOSFET is perpendicular to the channel of the N channel MOSFET. This arrangement can reduce a total channel resistance. The P channel MOSFET is formed so that the channel is parallel to the $<01\bar{1}>$ direction, for example, and the N channel MOSFET is formed so that the channel is perpendicular to the $<01\bar{1}>$ direction.

15 Claims, 5 Drawing Sheets

| CRYSTAL PLANE | (100) | (111) | (011)//<01$\bar{1}$> | (011)⊥<01$\bar{1}$> |
|---|---|---|---|---|
| ELECTRON SURFACE MOBILITY (cm²/Vsec) | 436 | 333 | 230 | 291 |
| HOLE SURFACE MOBILITY (cm²/Vsec) | 95 | 135 | 230 | 155 |
| CHANNEL RESISTANCE OF N-TYPE MOSFET | R | 1.3R | 1.9R | 1.5R |
| CHANNEL RESISTANCE OF P-TYPE MOSFET | 4.6R | 3.2R | 1.9R | 2.8R |

CMOS DEVICE WITH PERPENDICULAR CHANNEL CURRENT DIRECTIONS

BACKGROUND OF THE INVENTION

The present invention relates to a semiconductor device having a P channel MOSFET (PMOS) and an N channel MOSFET (NMOS), and more specifically to a semiconductor device of such a type designed to improve a current driving capability.

PMOS and NMOS devices are used in pairs in a H bridge type motor control circuit, as shown in FIG. 5, for driving a load in the form of a DC motor in forward and reverse directions. This circuit includes a first PMOS 60 connected between a power supply terminal 31 and a first terminal of a DC motor 32, a second PMOS 80 connected between the supply terminal 31 and a second terminal of the DC motor 32, a first NMOS 70 connected between the second terminal of the DC motor 32 and a ground terminal, and a second NMOS 90 connected between the first terminal of the DC motor 32 and the ground terminal (earth terminal). The DC motor 32 is driven in the forward direction by a current flowing in a direction A shown in FIG. 5 when the first PMOS 60 and NMOS 70 are turned on. On the other hand, the second PMOS 80 and NMOS 90 turn on and allow a current to flow in a direction B to drive the DC motor 32 in the reverse direction. In either case, the current flows through one pair of the PMOS and NMOS 60 and 70, or 80 and 90.

In this way, a current in the H bridge circuit necessarily flows through a pair of switching devices between the power supply and ground. Such a circuit is called a push-pull circuit. Other examples of the push-pull circuit are a circuit for driving a three-phase motor, and an inverter circuit.

Monolithic integrated circuits having a plurality of MOSFETs formed on and/or within a single semiconductor substrate are very advantageous, as is well known, in reliability and fabricating cost. In general, the monolithic IC technologies use semiconductor substrates, such as silicon substrates, having one major surface which is the (100) crystal plane. The (100) oriented substrates are preferred because the surface mobility of electrons is higher in the (100) plane than in other crystal planes, further because the interface level density (or the interface trap density) is lower in the interface between the (100) silicon plane and a SiO2 film, and further because various data have been accumulated for the widely used (100) wafers.

It is possible to form the PMOS 60 and NMOS 90 shown in FIG. 5 in and on a single crystal semiconductor substrate. In a conventional monolithic IC structure, however, the PMOS and NMOS are arranged so that the currents of the PMOS and NMOS flow in the same direction.

The dependencies of the surface mobilities of electrons and holes on the semiconductor crystal plane orientation are shown in Kischino and Koyanagi "Physics of VLSI Devices (*Denshi Zairyo* Series)", page 145, published by MARUZEN Co. Ltd. in 1986. According to this document, the (100), (111) and (011) planes have values of the surface mobilities of electrons and holes and the channel resistances of NMOS and PMOS as listed in a table of FIG. 6.

In the table of FIG. 6, it is assumed that the channel resistances of NMOS and PMOS are inversely proportional to the surface mobilities of electrons and holes, respectively, and the channel resistance values are shown by using the channel resistance value of NMOS on the (100) plane as a standard of comparison. On the (011) plane, the surface mobilities differ according to the current direction. FIG. 6 shows the surface mobilities in the direction parallel to the $<01\bar{1}>$ direction on the (011) plane and in the direction perpendicular to the $<01\bar{1}>$ direction on the (011) plane.

As evident from FIG. 6, the (100) plane makes the electron surface mobility higher, and the NMOS channel resistance lower. However, the hole surface mobility is low, and accordingly the PMOS channel resistance is high in the (100) plane. When PMOS and NMOS are integrated into a monolithic circuit of a semiconductor substrate having a surface of the (100) crystal plane, and used in the H-bridge motor control circuit shown in FIG. 5, the total on resistance in the on state for driving the motor is determined by the sum of the channel resistances of PMOS and NMOS, and amounts to as high as 5.6 R. As the total on resistance increases, the current driving capability to the load becomes lower, and the switching devices produce more heat.

According to the table of FIG. 6, the total channel resistances of PMOS and NMOS is lower in the (111) plane than in the (100) plane. Therefore, the use of the (111) plane can reduce the total on resistance. The (111) wafers were used in early P channel enhancement type MOSFET integrated circuits.

The total channel resistance of PMOS and NMOS on the (011) plane is lower, without regard to the current direction, than that of the (111) plane. A conventional monolithic circuit including PMOS and NMOS formed in a (011) semiconductor substrate is disclosed in "Fully Symmetric Cooled CMOS" on (110) plane, M. Aoki, K. Yano, T. Masuhara and K. Shimohigashi, IEEE Transactions on Electron Devices, vol. IE$^3$-ED, No. 8, August 1989, pp. 1429-1433. In this semiconductor device, a CMOS inverter is composed of PMOS and NMOS formed in parallel on the (011) surface of the semiconductor substrate. The parallel arrangement of the PMOS and NMOS makes the surface mobilities of both MOS transistors equal. However, this document is silent about the difference of the surface mobilities due to the current direction difference. The PMOS and NMOS are arranged in parallel presumably because the surface mobilities are equal between the PMOS and NMOS when the currents of the PMOS and NMOS both flow in the direction parallel to the $<01\bar{1}>$ direction.

In the direction parallel to the $<01\bar{1}>$ direction on the (011) plane, the hole surface mobility is higher and the electron surface mobility is lower as compared with the direction perpendicular to the $<01\bar{1}>$ direction. As a result, the parallel arrangement of the PMOS and NMOS makes the total on resistance higher and degrades the current driving capability. In the case of the CMOS circuit, the area required to form each MOSFET is inversely proportional to the surface mobility of electrons or holes, and proportional to the channel resistance of PMOS or NMOS. As a result, the parallel arrangement cannot reduce the required area.

SUMMARY OF THE INVENTION

It is therefore an object of the present invention to provide a semiconductor device which has a low total channel resistances of a P channel MOSFET and an N channel MOSFET, and a superior current driving capability, and which is advantageous in size reduction when applied to a CMOS circuit.

According to the present invention, a semiconductor device comprises a first pair of source and drain regions which form a P channel MOSFET and a second pair of source and drain regions which form an N channel MOSFET. All the regions are formed in a (011) oriented semiconductor substrate having a (011) surface orientation. In this semiconductor substrate, the source and drain regions of the P channel and N channel MOSFETs are so arranged that a direction of a main current component flowing in the P channel MOSFET is perpendicular to a direction of a main current component flowing in the N channel MOSFET.

Preferably, the source and drain regions of the P channel MOSFET are formed so that the direction of the main current component is parallel to the $<01\bar{1}>$ crystal direction of the (011) semiconductor substrate, and the source and drain regions of the N channel MOSFET are formed so that the direction of the main current component is perpendicular to the $<01\bar{1}>$ direction.

The orthogonal arrangement of the present invention as distinguished from the conventional parallel arrangement can make use of the best combination of the surface mobilities of electrons and holes, improve the current driving capability by reducing the total channel resistances of the P channel MOSFET and the N channel MOSFET, and reduce the chip size when applied to the CMOS circuit.

BRIEF DESCRIPTION OF THE DRAWINGS

FIG. 6 is a table showing the dependencies of the carrier surface mobilities and MOSFET channel resistances on the crystal orientations.

DETAILED DESCRIPTION OF THE INVENTION

Figure 1:
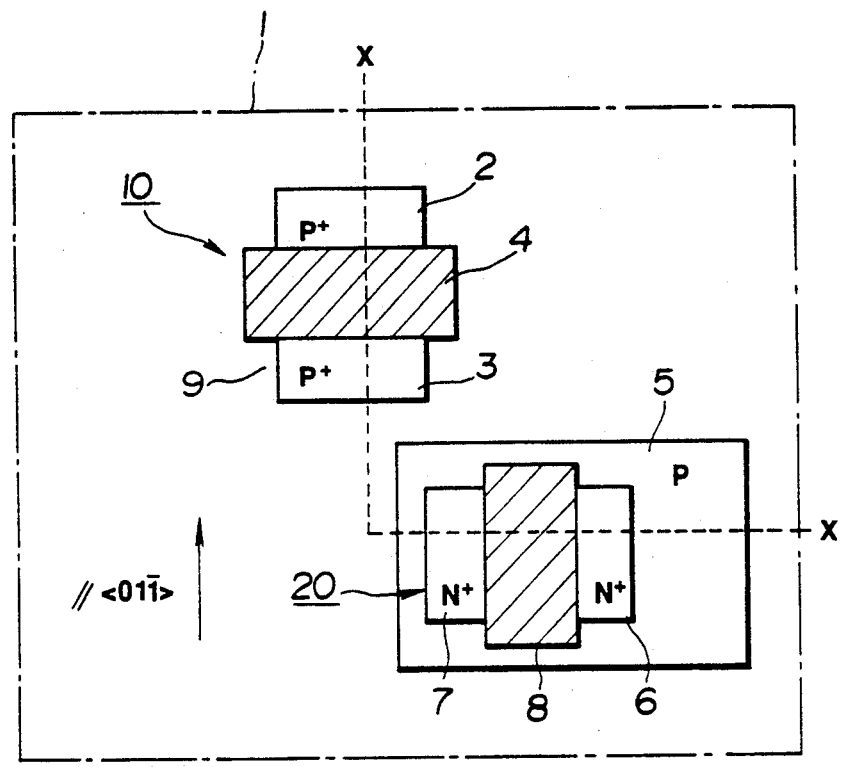
FIG. 1 is a schematic plan view showing a semiconductor device according to a first embodiment of the present invention.
Figure 2:
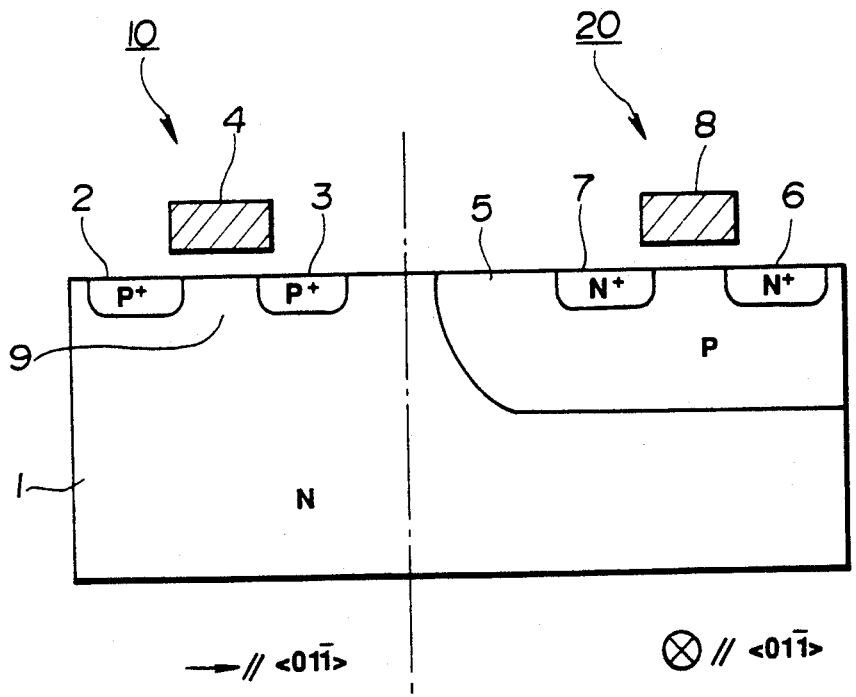
FIG. 2 is a sectional view taken along a line X—X in FIG. 1.

FIGS. 1 and 2 shows a semiconductor device according to a first embodiment of the present invention.

The semiconductor device shown in FIGS. 1 and 2 employs an N-type semiconductor substrate 1 having a first major surface which is a (011) crystal plane. The substrate 1 has an N-type bulk substrate region (or layer). A pair of P+-type source and drain regions 2 and 3 are formed in the N-type substrate region 9 (or layer) of the (011) substrate 1. Each of the source and drain regions 2 and 3 extends into the substrate 1 from the first major surface. A gate electrode 4 is formed on a gate insulating layer formed on the major surface of the semiconductor substrate. The source and drain regions 2 and 3 and the gate electrode 4 form a PMOS 10.

A P well region (or P-type substrate region) 5 is formed in the (011) substrate 1, and extends from the first major surface into the substrate 1. A pair of N+ source and drain regions 6 and 7 are formed in the P well region 5, and extend from the first major surface of the (011) substrate 1 into the p well region 5. A gate electrode 8 is formed on a gate insulating layer formed on the first major surface of the semiconductor substrate 1. The source and drain regions 6 and 7 and the gate electrode 8 form an NMOS 20.

The P+ source and drain regions 2 and 3 of the PMOS 10 are arranged so that they confront each other in a first direction which is parallel to the $<01\bar{1}>$ direction of the semiconductor substrate 1. The N+ source and drain regions 6 and 7 of the NMOS 20 are arranged so that they confront each other in a second direction which is perpendicular to the $<01\bar{1}>$ direction.

It is possible to fabricate the semiconductor structure shown in FIGS. 1 and 2 by a fabrication process similar to a known process for fabricating a known P well CMOS structure in an N substrate.

Figure 5:
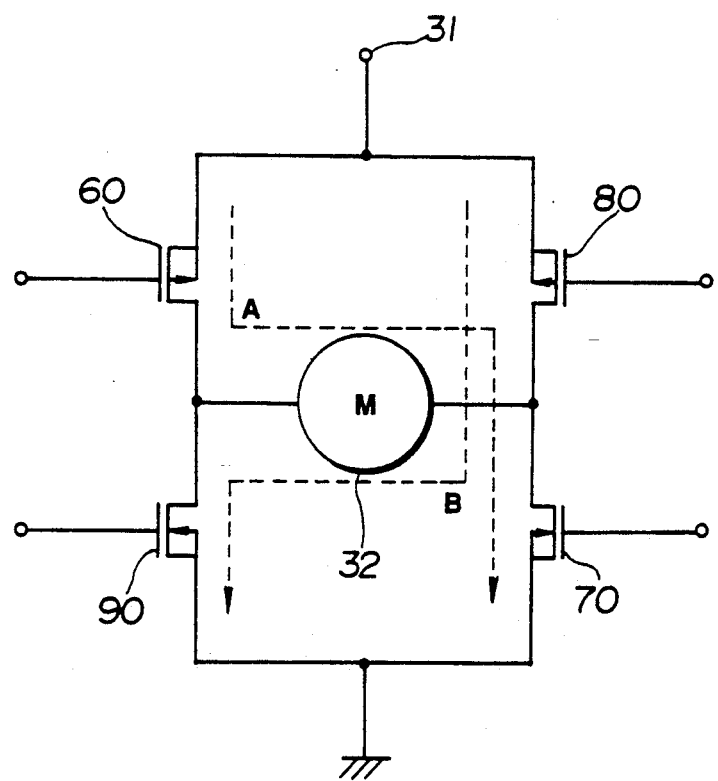
FIG. 5 is a diagram showing a conventional H-bridge motor control circuit.

The semiconductor device shown in FIGS. 1 and 2 can be used in a H bridge type motor control circuit as shown in FIG. 5. In this case, a current of the PMOS 10 flows from the P+ source region 2 to the P+ drain region 3 in parallel to the $<01\bar{1}>$ direction. On the other hand, a current of the NMOS 20 flows from the N+ drain region 7 to the N+ source region 6 along the second direction which is perpendicular to the $<01\bar{1}>$ direction. According to the table of FIG. 6, the total channel resistance of this combination amounts to 3.4 R. This total amount is lower than the total channel resistance of any of the cases of the (100) substrate, the (111) substrate, and the (011) substrate having the parallel structure in which the main current paths of the PMOS and NMOS are parallel to each other. Therefore, the orthogonal structure on the (011) plane according to the first embodiment of the invention can improve the current driving capability for a load, and reduce the evolution of thermal energy and switching loss by reducing the total switch resistance.

The semiconductor device of the first embodiment can offer the following advantages when it is applied to a CMOS circuit. In general, a CMOS circuit is designed so that the channel widths of PMOS and NMOS are inversely proportional, respectively, to the surface mobility of holes and electrons, in order to make the current driving capabilities of the PMOS and NMOS equal to each other. Therefore, the area required to form each MOSFET is proportional to the channel width, and inversely proportional to the surface mobility of carriers. As a result, the required area is proportional to the channel resistance of PMOS or NMOS listed in FIG. 6. The orthogonal structure on the (011) plane can reduce the area required to form a CMOS circuit, that is, the sum of the areas required to fabricate the PMOS 10 and NMOS 20.

Figure 3:
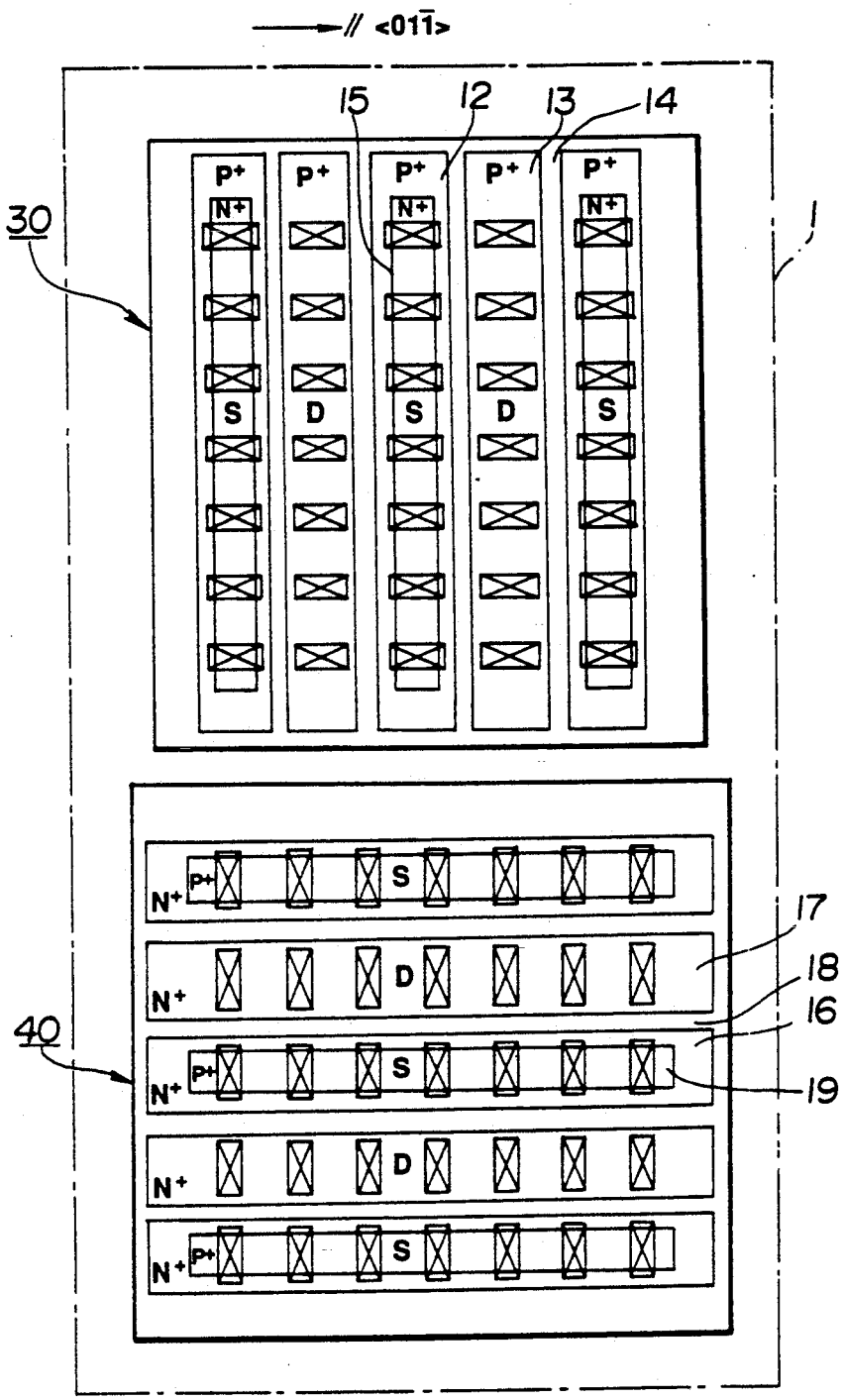
FIG. 3 is a schematic plan view showing a semiconductor device according to a second embodiment of the present invention.

FIG. 3 shows a semiconductor device according to a second embodiment of the present invention. This semiconductor device has a stripe type power MOSFET structure to further improve the current driving capability by making the channel width longer.

This semiconductor device has at least one P+ source region 12, at least one P+ drain region 13 and at least one gate electrode 14 which forms a PMOS 30 with the source and drain regions 12 and 13. The source and drain regions 12 and 13 are formed in a (011) N semiconductor substrate 1. The source and drain regions 12 and 13 extend into the (011) semiconductor substrate from a first major surface having the (011)

plane orientation. The gate electrode 14 is formed on a gate insulating layer formed on the first major surface of the semiconductor substrate. The semiconductor device shown in FIG. 3 further includes at least one N+ source region 16, at least one N+ drain region 17, and a gate electrode 18 which forms an NMOS 40. Each of the N+ source and drain regions 16 and 17 is formed in a P well region formed in the N substrate 1 as in the device shown in FIGS. 1 and 2, and extends into the well region from the first major surface of the (011) substrate. The gate electrode 18 is formed on a gate insulating layer on the first major surface of the semiconductor substrate 1.

The P+ source and drain regions 12 and 13 of the PMOS 30 are arranged so that they confront each other in the first direction which is parallel to the $<01\bar{1}>$ direction of the (011) substrate. The N+ source and drain regions 16 and 17 are arranged so that they confront each other in the second direction which is perpendicular to the $<01\bar{1}>$ direction.

The power MOSFET is required to handle a higher current than a general MOSFET used in an IC, and hence to be strong against secondary breakdown. In the semiconductor device shown in FIG. 3, there are formed N well contact region 15 and P well contact region 19 to ensure the transistor operation free from secondary breakdown.

It is possible to fabricate the semiconductor device according to the second embodiment by a process similar to the CMOS fabricating process as in the first embodiment, or by a double diffusion process often used for fabricating power MOSFETs.

The semiconductor device according to the second embodiment can be also used in the H bridge motor control circuit. In this case, the device is operated in the same manner as the device of the first embodiment. The semiconductor device according to the second embodiment can further improve the current driving capability to a load.

As shown in FIG. 3, there are formed, in the first surface of the substrate, a plurality of rectangular stripe zones of the source and drain of the PMOS 30 which are parallel to one another and which are arranged alternately, and a plurality of rectangular stripe zones of the source and drain of the NMOS 40 which are parallel to one another and which are arranged alternately.

Figure 4:
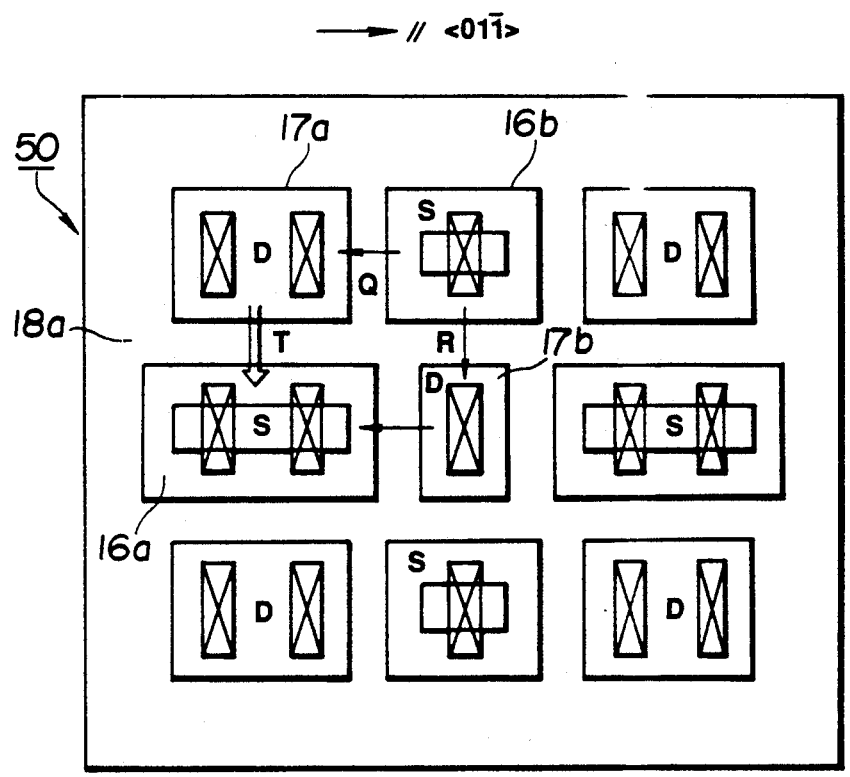
FIG. 4 is a schematic plan view showing a semiconductor device according to a third embodiment of the present invention.

FIG. 4 shows a semiconductor device according to a third embodiment of the present invention. The lateral layout of this semiconductor device is a variation of that of the second embodiment. In order to further increase the channel width, the semiconductor device of the third embodiment is designed to divide the stripes of the source and drain regions and increase the channel density.

FIG. 4 shows only an NMOS 50. The N+ source region comprises at least one first portion 16a and at least one second portion 16b. The N+ drain region comprises at least one first portion 17a and at least one second portion 17b. A gate electrode 18a is formed on a gate insulating layer to form the NMOS 50 with the N+ source and drain regions as in the preceding embodiments. In the same semiconductor substrate, there is formed a PMOS having a planar pattern which is similar to that of the NMOS 50 but which is oriented so that the PMOS pattern and the NMOS pattern can be made coincident with each other by a rotation through 90°.

In the structure in which the source and drain regions are divided in a manner of cell division, the current does not flow in a single direction, but the flow of current is complicated. In the device shown in FIG. 4, for example, currents flow in directions shown by arrows Q, R and T in FIG. 4. However, a main current flows in the T direction because the confronting surfaces of the source and drain regions which are perpendicular to the T direction are wider than the other confronting surfaces in other directions. As a result, the main current of the NMOS 50 flows in the direction perpendicular to the $<01\bar{1}>$ direction of the substrate.

The device of the third embodiment can offer advantages similar to those of the second embodiment, and further improve the current driving capability to load.

In each of the embodiments of the invention, the plane patterns of the PMOS and NMOS are made similar to each other. However, it is optional to employ the PMOS and NMOS patterns which are not similar to each other as long as the main current directions of both MOS transistors are defined according to the invention. In fact, it is necessary to design the PMOS and NMOS patterns individually with consideration for the difference in diffusion rate between P type impurities and N type impurities.

As explained above, the IC device according to each of the embodiments of the present invention includes at least the P-type source and drain regions of the PMOS and the N-type source and drain regions of the NMOS. The regions of the PMOS and NMOS are formed in a single crystal semiconductor substrate having at least one surface which is the (011) crystal plane. Each region extends into the substrate from the above-mentioned (011) surface of the substrate. The source and drain regions of both MOS transistors are arranged so that the channels (i.e. main current paths) of the PMOS and NMOS are not parallel to each other but substantially perpendicular to each other. In each embodiment, the P source and drain regions of the PMOS are formed in an N-type substrate region of the semiconductor substrate, as best shown in FIG. 2. The N-type source and drain regions of the NMOS are formed in a P-type substrate region, such as a P well region, in the semiconductor substrate. The N-type substrate region has a channel portion which is sandwiched between the P source and drain regions of the PMOS. This channel portion forms a source junction with the P source region and a drain junction with the P drain region. The source and drain junctions both extend in the surface of the substrate along a predetermined imaginary first straight line. Similarly, the P substrate region has a channel region which is sandwiched between the N source and drain regions of the NMOS. This channel portion of the P type forms a source junction with the N source region and a drain junction with the N drain region. The source and drain junctions of the NMOS both extend in the surface of the semiconductor substrate along a second imaginary straight line which is substantially perpendicular to the first straight line.

What is claimed is:

1. A semiconductor device comprising:
   a first pair of source and drain regions which form a P channel MOSFET, and which are formed in a (011) oriented semiconductor substrate comprising a first surface of a (011) crystal plane; and
   a second pair of source and drain regions which form an N channel MOSFET and which are formed in said (011) oriented semiconductor substrate;
   wherein said source and drain regions of said P channel and N channel MOSFETs are arranged so that a first direction of a main current component flowing in said P channel MOSFET is substantially perpendicular to a second direction of a main current component flowing in said N channel MOSFET;

wherein at least one of said source regions and said drain regions of at least one of said P channel and N channel MOSFETs comprises first and second portions which are separated from each other, and which are different in lateral geometry from each other.

2. A semiconductor device according to claim 1 wherein said source and drain regions of said P channel MOSFET are formed so that said first direction of said main current component flowing in said P channel MOSFET is parallel to a <01$\bar{1}$> direction of said (011) semiconductor substrate, and said source and drain regions of said N channel MOSFET are formed so that said second direction of said main current component flowing in said N channel MOSFET is perpendicular to said <01$\bar{1}$> direction.

3. A semiconductor device according to claim 1 wherein said source and drain regions of said P channel MOSFET are separated along said first direction so that a channel is formed in said first direction between said source and drains regions of said P channel MOSFET, and said source and drain regions of said N channel MOSFET are separated along said second direction so that a channel is formed between said source and drain regions of said N channel MOSFET in said second direction which is perpendicular to said first direction.

4. A semiconductor device according to claim 3 wherein said source and drain regions of said P channel MOSFET are formed in an N-type substrate region which is formed in said (011) semiconductor substrate, and said source and drain regions of said N channel MOSFET are formed in a P-type substrate region which is formed in said (011) semiconductor substrate, and wherein all of said regions extend into said (011) semiconductor surface from said first surface.

5. A semiconductor device according to claim 4 wherein each of said source and drain regions of said P channel and N channel MOSFETs comprises a rectangular zone lying in said first surface of said (011) semiconductor substrate, and wherein said rectangular zones of said source and drain regions of said P channel MOSFET extend in parallel to each other along said second direction, and said rectangular zones of said source and drain regions of said N channel MOSFET extend in parallel to each other in said first direction.

6. A semiconductor device according to claim 1 wherein:

said source region of said N channel MOSFET comprises a plurality of first source portions and a plurality of second source portions, said second source portions of said N channel MOSFET being different in lateral geometry from said first source portions of said N channel MOSFET;

said drain region of said N channel MOSFET comprises a plurality of first drain portions and a plurality of second drain portions, said second drain portions of said N channel MOSFET being different in lateral geometry from said first drain portions of said N channel MOSFET;

said source region of said P channel MOSFET comprises a plurality of first source portions and a plurality of second source portions, said second source portions of said P channel MOSFET being different in lateral geometry from said first source portions of said P channel MOSFET; and said drain region of said P channel MOSFET comprises a plurality of first drain portions and a plurality of second drain portions, said second drain portions of said P channel MOSFET being different in lateral geometry from said first drain portions of said P channel MOSFET.

7. A semiconductor device according to claim 6 wherein:

each of said first and second source portions and said first and second drain portions of said N channel and P channel MOSFETs is substantially in a form of a quadrilateral, having four interior right angles, two parallel first sides of respectively equal length and two parallel second sides of respectively equal length in a plan view;

in said N channel MOSFET said first sides of each of said first and second source portions and said first and second drain portion are parallel to a <01$\bar{1}$> direction of said (011) semiconductor substrate;

in said P channel MOSFET said first sides of each of said first and second source portions and said first and second drain portion are perpendicular to said <01$\bar{1}$> direction of said (011) semiconductor substrate;

the length of said first sides of said first source portions of said N channel MOSFET are greater than each of the length of said second sides of said first source portions of said N channel MOSFET, the length of said first sides of said second source portions of said N channel MOSFET and the length of said second sides of said second source portions of said N channel MOSFET; and the length of said first sides of said first source portions of said P channel MOSFET are greater than each of the length of said second sides of said first source portions of said P channel MOSFET, the length of said first sides of said second source portions of said P channel MOSFET and the length of said second sides of said second source portions of said P channel MOSFET.

8. A semiconductor device according to claim 7 wherein said first and second source portions and said first and second drain portions of said N channel MOSFET are regularly arranged; one of said first sides of each of said first source portions of said N channel MOSFET confronts one of said first sides of a neighboring one of said first drain portions of said N channel MOSFET; one of said second sides of each of said first source portions of said N channel MOSFET confronts one of said second sides of a neighboring one of said second drain portions of said N channel MOSFET; one of said first sides of each of said second source portions of said N channel MOSFET confronts one of said first sides of a neighboring one of said second drain portions of said N channel MOSFET; and one of said second sides of each of said second portions of said N channel MOSFET confronts one of said second sides of a neighboring one of said first drain portions of said N channel MOSFET.

9. A semiconductor device according to claim 8 wherein:

said first and second source portions and said first and second drain portions of said P channel MOSFET are regularly arranged;

one of said first sides of each of said first source portions of said P channel MOSFET confronts one of said first sides of a neighboring one of said first drain portions of said P channel MOSFET;

one of said second sides of each of said first source portions of said P channel MOSFET confronts one of said second sides of a neighboring one of said second drain portions of said P channel MOSFET;

one of said first sides of each of said second source portions of said P channel MOSFET confronts one of said first sides of a neighboring one of second drain portions of said P channel MOSFET; and one of said second sides of each of said second source portion of said P channel MOSFET confronts one of said second sides of a neighboring one of said first drain portions of said P channel MOSFET.

10. A semiconductor device according to claim 9 wherein:

the length of said first sides of said first drain portions of said N channel MOSFET are greater than each of the length of said second sides of said first drain portions of said N channel MOSFET, the length of said first sides of said drain portions of said N channel MOSFET and the length of said second sides of said second drain portions of said N channel MOSFET; and the length of said first sides of said first drain portions of said P channel MOSFET are greater than each of the length of said second sides of said first drain portions of said P channel MOSFET, the length of said first sides of said second drain portions of said P channel MOSFET and the length of said second sides of said second drain portions of said P channel MOSFET.

11. A semiconductor device according to claim 7 wherein:

the length of said first sides of said first drain portions of said N channel MOSFET are greater than each of the length of said second sides of said first drain portions of said N channel MOSFET, the length of said first sides of said second drain portions of said N channel MOSFET and the length of said second sides of said second drain portions of said N channel MOSFET; and the length of said first sides of said first drain portions of said P channel MOSFET are greater than each of the length of said second sides of said first drain portions of said P channel MOSFET, the length of said first sides of said second drain portions of said P channel MOSFET and the length of said second sides of said second drain portions of said P channel MOSFET.

12. A semiconductor device according to claim 1 wherein the source region of said N channel MOSFET comprises a first source portion and a second source portion, wherein said second source portion is square and said first source portion is rectangular with unequal adjacent sides and is not square.

13. A semiconductor device comprising:

a first pair of source and drain regions which form a P channel MOSFET, and which are formed in a (011) oriented semiconductor substrate comprising a first surface of a (011) crystal plane; and a second pair of source and drain regions which form an N channel MOSFET and which are formed in said (011) oriented semiconductor substrate;

wherein said source and drain regions of said P channels and N channel MOSFETs are arranged so that a fist direction of a main current component flowing in said P channel MOSFET is substantially perpendicular to a second direction of a main current component flowing in said N channel MOSFET;

wherein said source and drain regions of said P channel MOSFET are formed in an N-type substrate region which is formed in said (011) semiconductor substrate, and said source and drain regions of said N channel MOSFET are formed in a P-type substrate region which is formed in said (011) semiconductor substrate, and wherein all of said regions extend into said (011) semiconductor surface from said first surface; and wherein each of said source and drain regions of said P channel and N channel MOSFETs comprises a plurality of stripe zones lying in said first surface of said (011) semiconductor substrate, and wherein said stripe zones of said source and drain regions of said P channel MOSFET alternate with each other and all extend in parallel along said second direction in said first surface of said (011) semiconductor substrate, and said stripe zones of said source and drain regions of said N channel MOSFET alternate with each other and all extend in parallel along said first direction in said first surface of said (011) semiconductor substrate.

14. A semiconductor device comprising:

a pair of P+-type source and drain regions which form a P channel MOSFET, and which are formed in a (011) oriented semiconductor substrate comprising a first surface of a (011) crystal plane; and a pair of N+-type source and drain regions which form an N channel MOSFET and which are formed in said (011) oriented semiconductor substrate;

wherein said source region of said N channel MOSFET comprises a plurality of first N+-type source portions and a plurality of second N+-type source portions, said drain region of said N channel MOSFET comprises a plurality of first N+-type drain portions and a plurality of second N+-type drain portions, said source region of said P channel MOSFET comprises a plurality of first P+-type source portions and a plurality of second P+-type source portions, and said drain region of said P channel MOSFET comprises a plurality of first P+-type drain portions and a plurality of second P+-type drain portions; and wherein each of said first second source portions and said first and second drain portions of said N channel and P channel MOSFETs is substantially in a form of a rectangle having two parallel first sides and two parallel second sides in a lateral pattern of a semiconductor device, the first sides of the rectangles of the first and second source portions and said first and second drain portions of said N channel MOSFET are substantially parallel to said $<01\bar{1}>$ direction of said (011) semiconductor substrate, the first sides of the rectangles of the first and second source portions and said first and second drain portions of said P channel MOSFET are substantially perpendicular to said $<01\bar{1}>$ direction of said (011) semiconductor substrate, the length of said first sides of said first source portions of said N channel MOSFET are greater than each of the length of said second sides of said first source portions of said N channel MOSFET, the length of said first sides of said second source portions of said N channel MOSFET and the length of said second sides of said second source portions of said N channel MOSFET, and the length of said first sides of said first source portions of said P channel MOSFET are greater than each of the length of said second sides of said first source portions of said P channel MOSFET, the length of said first sides of said second source portions of said P channel MOSFET and the length of said second sides of said second source portions of said P channel MOSFET.

15. A semiconductor device according to claim 14 wherein:

the length of said first sides of said first drain portions of said N channel MOSFET are greater than each of the length of said second sides of said first drain portions of said N channel MOSFET, the length of said first sides of said second drain portions of said N channel MOSFET and the length of said second sides of said second drain portions of said N channel MOSFET; and the length of said first sides of said first drain portions of said P channel MOSFET are greater than each of the length of said second sides of said first drain portions of said P channel MOSFET, the length of said first sides of said second drain portions of said P channel MOSFET and the length of said second sides of said second drain portions of said P channel MOSFET.

* * * * *